(12) United States Patent
Kimura (10) Patent No.: US 6,798,665 B2
(45) Date of Patent: Sep. 28, 2004

(54) MODULE AND METHOD OF MANUFACTURING THE MODULE

(75) Inventor: Junichi Kimura, Aichi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 49 days.

(21) Appl. No.: 10/090,786

(22) Filed: Mar. 6, 2002

(65) Prior Publication Data

US 2003/0169571 A1 Sep. 11, 2003

(51) Int. Cl.[7] .................................................. H05K 1/14
(52) U.S. Cl. .................... 361/736; 361/748; 361/774; 174/262; 174/266; 29/852
(58) Field of Search .................................... 361/748, 736, 361/774, 814, 816, 818, 800, 728; 174/52.4, 262, 266; 438/125; 29/852, 650

(56) References Cited

U.S. PATENT DOCUMENTS

| | | | |
|---|---|---|---|
| 6,320,739 B1 * | 11/2001 | Gotoh et al. ................. | 361/820 |
| 6,338,893 B1 * | 1/2002 | Kodera et al. ............... | 428/210 |
| 6,344,609 B1 * | 2/2002 | Nakano .................. | 174/35 GC |
| 6,372,985 B1 * | 4/2002 | Shimoe ...................... | 174/52.4 |
| 6,373,714 B1 * | 4/2002 | Kudoh et al. ................ | 361/760 |
| 6,396,335 B1 * | 5/2002 | Behzad et al. .............. | 327/543 |
| 6,534,726 B1 * | 3/2003 | Okada et al. ............... | 174/263 |
| 6,571,469 B2 * | 6/2003 | Okada et al. .................. | 29/852 |

* cited by examiner

Primary Examiner—Kamand Cuneo
Assistant Examiner—Thanh Y. Tran
(74) Attorney, Agent, or Firm—Wenderoth, Lind & Ponack, L.L.P.

(57) ABSTRACT

A high-frequency module has a signal electrode provided on a cut side thereof, and is arranged to produce no burrs. The module includes a substantially four-sided substrate, a recess at a cut side of the substrate, and a signal electrode at the recess. The signal electrode is spaced from the cut side by a distance.

22 Claims, 8 Drawing Sheets

FIG. 1

- 25 Drilling
- 26 Copper Plate
- 27 Apply Resist
- 28 Cure Resist
- 29 Expose Resist to Light
- 30 Remove Resist
- 31 Remove Copper Plate
- 32 Store

- 35 Drill
- 36 Copper Plate
- 37 Apply Resist
- 38 Expose Resist to Light
- 39 Remove Resist
- 40 Remove Copper Plate
- 41 Store

MODULE AND METHOD OF MANUFACTURING THE MODULE

FIELD OF THE INVENTION

The present invention relates to a module such as a high-frequency module for a small sized electronic apparatus such as a mobile telephone, a method of manufacturing the module, and particularly to a signal electrode provided on a printed circuit board for the high-frequency module.

BACKGROUND OF THE INVENTION

A conventional high-frequency module includes a substrate of substantially a four-sided shape having a recess provided in each cut side thereof, an electronic component mounted on the substrate, and a signal electrode provided at the recesses. One end of the signal electrode is exposed at the cut sides.

Figure 18:
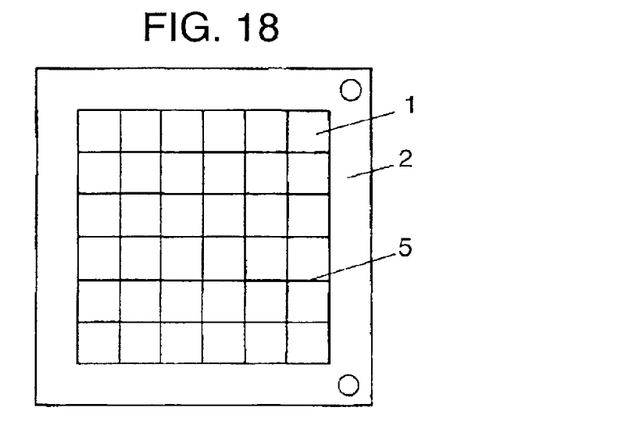
FIG. 18 is a plan view of a conventional printed mother board.
Figure 19:
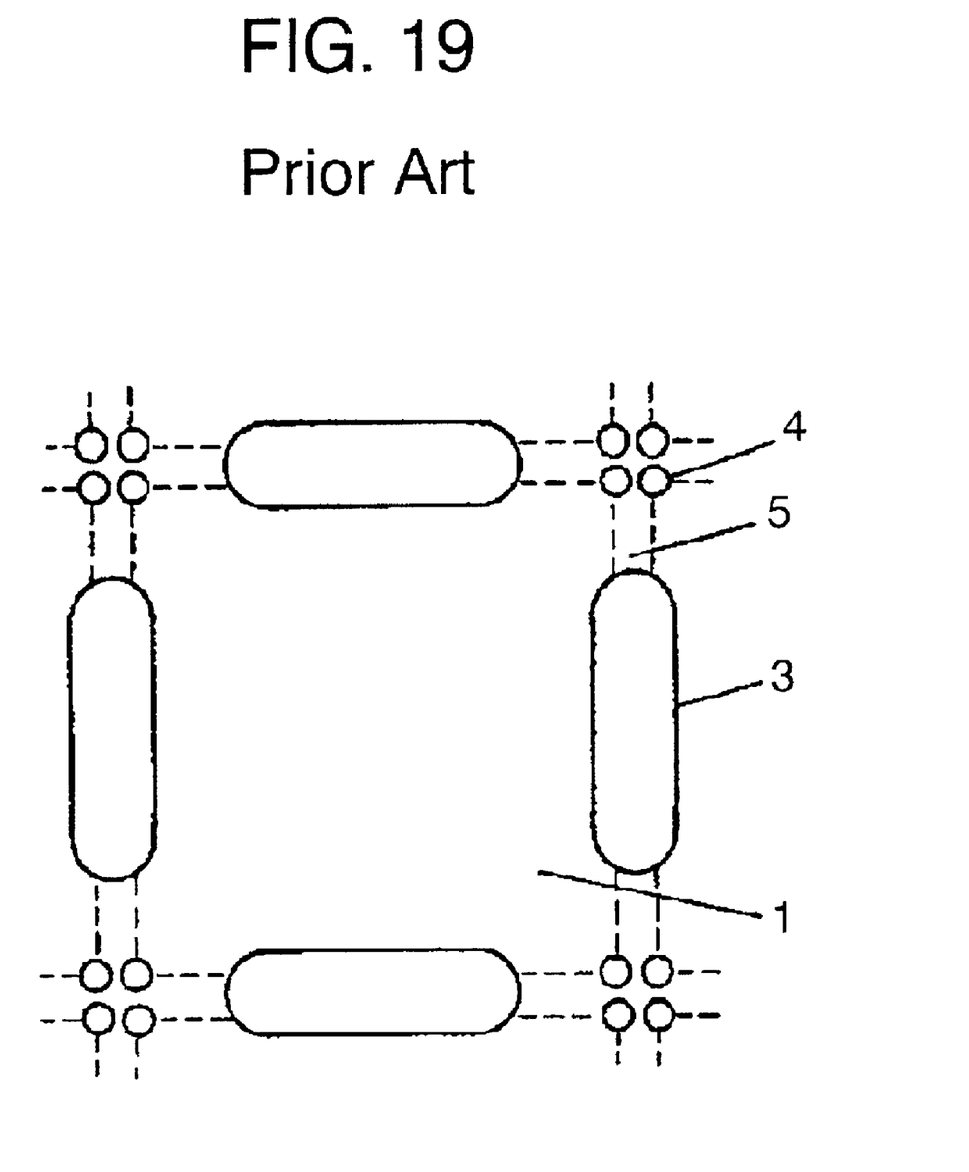
FIG. 19 is an enlarged plan view of a primary part of the conventional printed mother board.

The substrate is manufactured in the following manner. As shown in FIG. 18, a printed mother board 2 incorporates an array of substrates 1 for high-frequency modules. As shown in FIG. 19, each of the substrates 1 has a pattern of a signal electrode 3 provided at all lateral sides thereof where neighboring substrates 1 are linked. Also, a signal electrode 4 is provided at each corner of each substrate 1. The signal electrodes 3 and 4 are formed by forming holes and coating the holes with copper plating so as to allow the holes to function as through holes. The printed mother board 2 is then cut along a joint 5 to provide the substrates 1.

Because of having copper plated signal electrodes 3 and 4 cut along the joint 5, each conventional high-frequency module may have burrs developed at its edges. The burrs decline quality of the plating of each signal electrode. More specifically, when the module is mounted in a circuit assembly, the burrs possibly are detached by adverse vibrations, thus causing a short-circuit. Hence, the burrs need to be removed during an extra process step performed by a worker.

SUMMARY OF THE INVENTION

A module includes a substantially four-sided substrate having a recess formed at a lateral side thereof, an electrode provided at the recess of the substrate, an absent portion between lateral sides of the substrate, and an electronic component mounted on the substrate. The module has the electrode without unwanted burrs.

DETAILED DESCRIPTION OF THE PREFERRED EMBODIMENTS (Embodiment 1)

Figure 1:
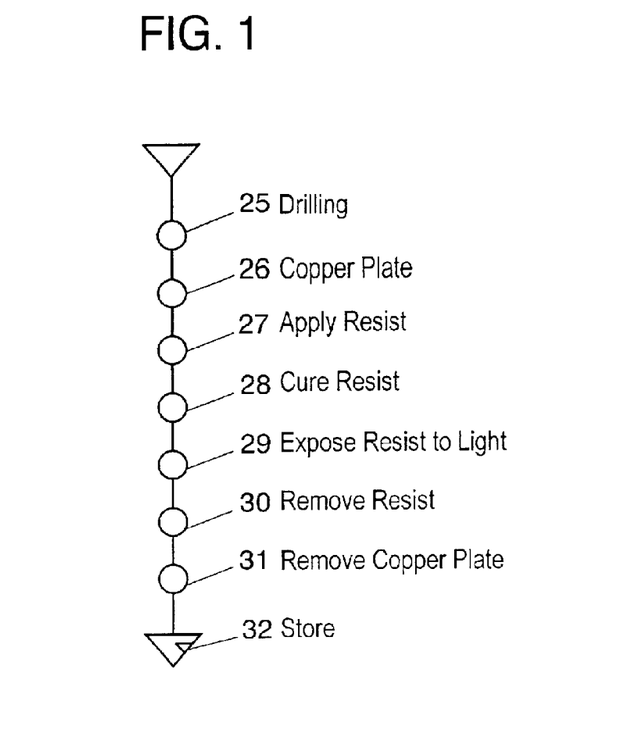
FIG. 1 is a flowchart for manufacturing a printed mother board according to Embodiment 1 of the present invention.
Figure 2:
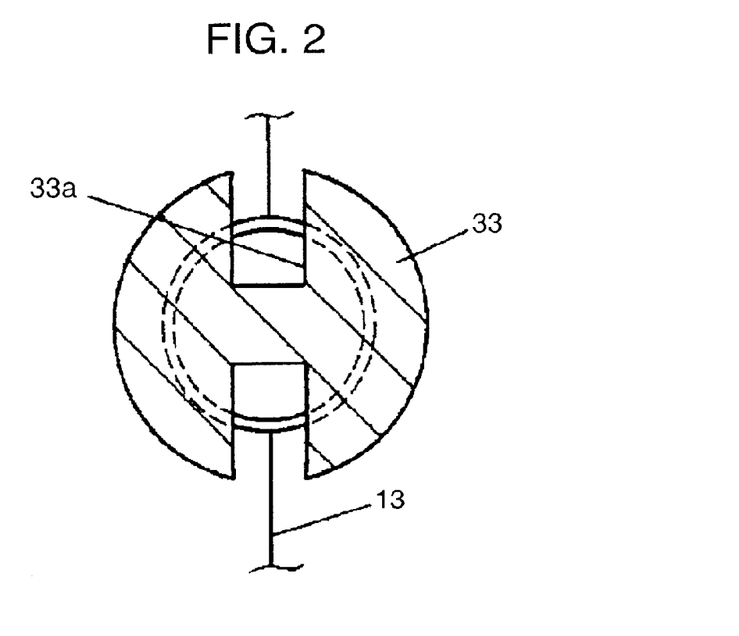
FIG. 2 is an enlarged plan view of a primary part of the printed mother board according to Embodiment 1.
Figure 3:
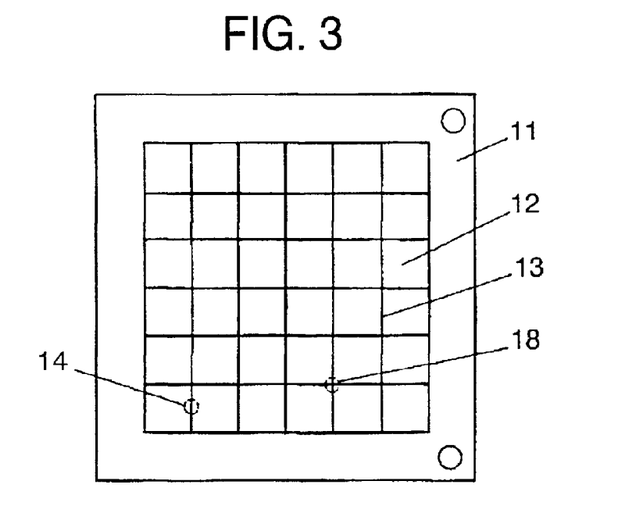
FIG. 3 is a plan view of the printed mother board according to Embodiment 1.
Figure 4:
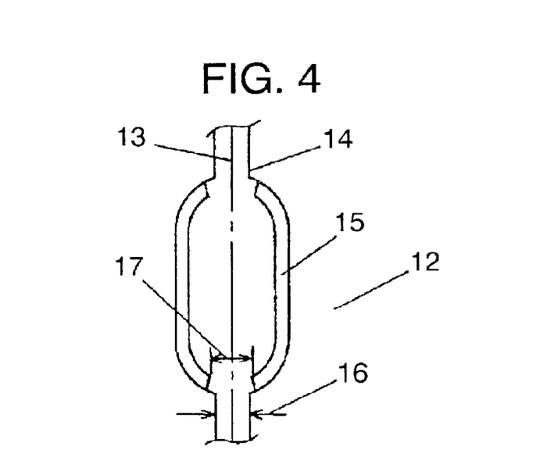
FIG. 4 is an enlarged plan view of a first primary part of the printed mother board according to Embodiment 1.
Figure 5:
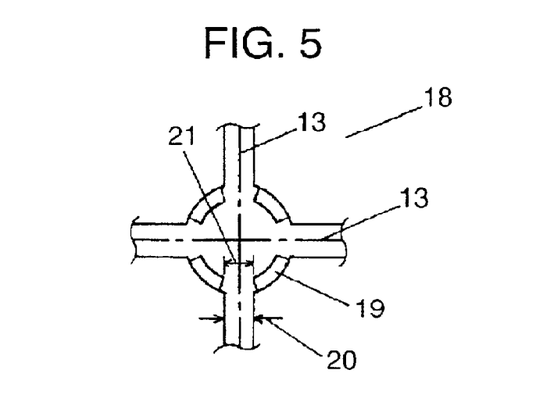
FIG. 5 is an enlarged plan view of a second primary part of the printed mother board according to Embodiment 1.
Figure 6:
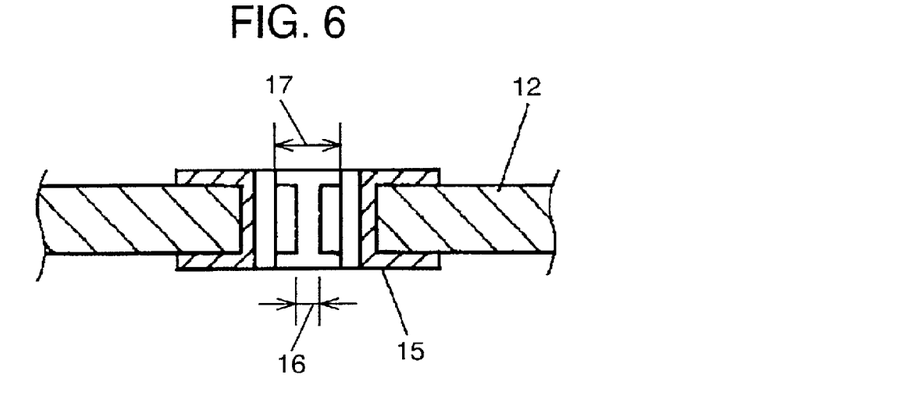
FIG. 6 is an enlarged cross sectional view of the primary part of the printed mother board according to Embodiment 1.
Figure 7:
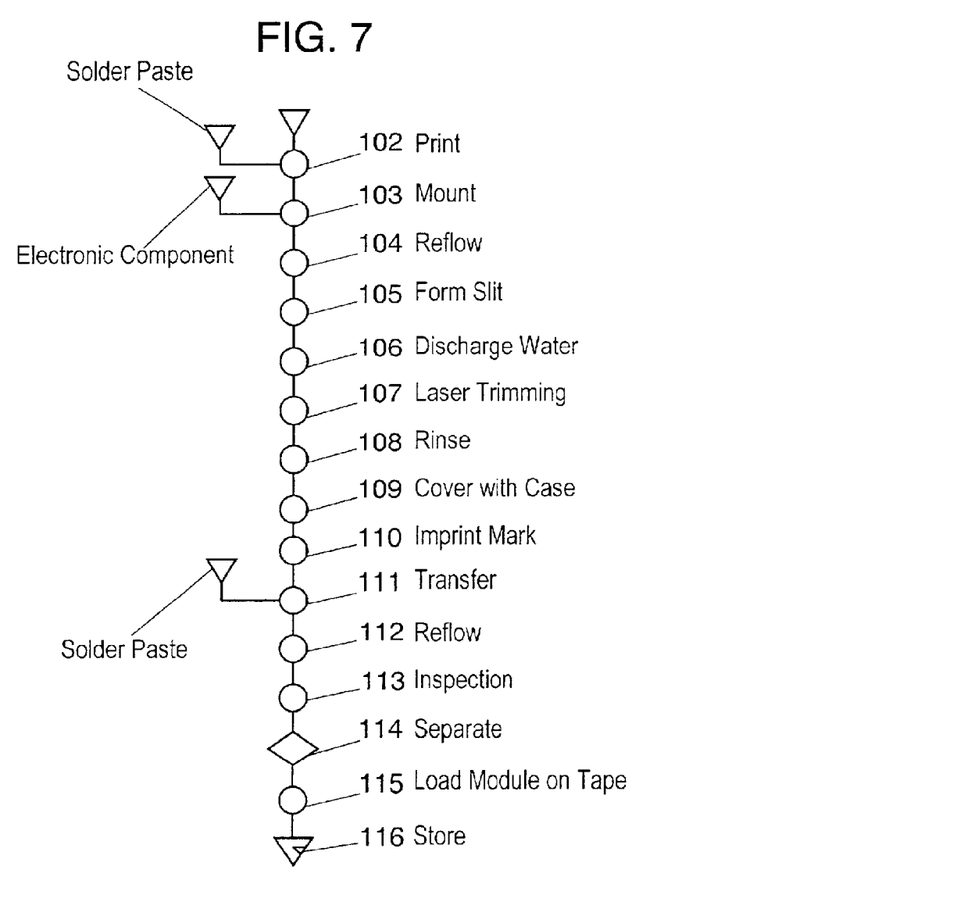
FIG. 7 is a flowchart for manufacturing a high-frequency module according to Embodiment 1.

FIG. 1 is a flowchart for manufacturing a printed mother board according to Embodiment 1 of the present invention. FIG. 2 is a plan view of a primary part of the printed mother board. FIG. 3 is a plan view of the printed mother board. FIG. 4 is a plan view of a first primary part of the printed mother board. FIG. 5 is a plan view of a second primary part of the printed mother board. FIG. 6 is a cross sectional view of the first primary part of the printed mother board. FIG. 7 is a flowchart for manufacturing a high-frequency module according to Embodiment 1.

Embodiment 1 of the present invention will be described referring to relevant drawings. A substrate used as a high-frequency module will be described first.

As shown in FIG. 3, a printed mother board 11 incorporates an array of substrates 12 where any two adjacent substrates are linked to each other along vertical and horizontal joints 13. FIG. 4 illustrates a substrate 12 having a signal electrode 15 provided on a link side 14 at which substrates adjoin. A copper-plating-absent region 17 is wider than a cutting strip 16 along which a joint 13 is separated. This allows the signal electrode 15 to generate no burrs during separation along the cutting strip 16.

FIG. 5 is an enlarged view of a corner joint 18 where four of the substrates 12 meet. A signal electrode 19 of each substrate 12 is provided at the corner joint 18 as shown in FIG. 5. Similar to FIG. 4, a copper-plating absent region 21 is wider than a cutting strip 20. This allows a corresponding signal electrode 19 to generate no burrs during separation along the cutting strip 20. Also, since four signal electrodes 19 are simultaneously provided when one single hole is drilled through the corner joint 18, a number of manufacturing steps can be reduced, and thus life of a drill used for drilling can be increased.

FIG. 6 is a cross sectional view of the signal electrode 15 manufactured by the above manner. Since the copper-plating-absent region 17 is wider than the cutting strip 16, burrs are hardly produced during separation along the cutting strip 16.

A procedure of manufacturing the signal electrodes 15 and 19 will be described in more detail referring to the flowchart of FIG. 1. The flowchart of FIG. 1 illustrates a procedure of manufacturing a printed mother board with a positive photo-resist. A through hole is drilled at a region for a signal electrode on a joint 13 of two adjoining substrates 12 of a printed mother board 11 (Step 25). Then, copper plating is performed at a region for a signal electrode about the hole (Step 26). This region is then coated with the resist (Step 27). The resist is then cured (Step 28). While covered with a mask 33 as shown in FIG. 2, the mother board is exposed to light (Step 29). The mask 33 has a recess 33a positioned over the signal electrode formed at a border of the two of the adjoining substrates 12. The adjoining substrates 12 are linked to each other along the joint 13. Only a portion corresponding to the recess 33a of the resist is exposed to light and thus decomposed. Then, decomposed portions of the resist are removed (Step 30). Copper plating at a portion where the resist is removed is removed (Step 31). Th printed mother board 11 is then stored (Step 32).

Then, solder paste is applied on the printed mother board 11 (Step 102) as shown in FIG. 7. Then an electronic component is mounted onto the printed mother board 11 (Step 103) and soldered to the substrates 12 with a reflow furnace (Step 104). On the board 11, a slit is formed along lateral sides of each substrate 12 by dicing (Step 105). The signal electrodes 15 and 19 of each substrate 12 are electrically separated from those of the adjoining substrates 12. Water for dicing is discharged (Step 106). Each substrate 12 is then provided with power from pins of an inspecting device for examining oscillation frequency (a first inspection), and is subjected to laser trimming to oscillate at a desired frequency (Step 107). Each substrate 12 is then rinsed (Step 108) and covered with a shield case (Step 109). A mark is impressed on the shield case (Step 110). A pattern of the solder paste is transferred onto each substrate 12 (Step 111) and subjected to a reflow process to fix the shield case onto the substrate 12 (Step 112). Each substrate 12 is finally examined (a second inspection) with regard to electrical properties (Step 112). The substrates 12 are then separated from the printed mother board 11 (Step 114). The substrates 12, high-frequency modules, are loaded onto a tape (Step 115) and stored (Step 116). Since the steps up to the final inspection at Step 113 are carried out with the substrates 12 in the form of a worksheet, i.e. the printed mother board 11 which is not separated, a high-frequency module can be manufactured significantly efficiently.

Referring to FIG. 2, two recesses 33a of the mask 33 are separated from each other by 180 degrees for determining a signal electrode 15 of a substrate 12. For determining signal electrodes 19 at a corner joint 18, mask 33 would include four recesses 33a provided therein at an equal intervals of 90 degrees. In this case, the mask 33 is placed with its recesses 33a positioned above the corner joint 18 where four substrates 12 meet. A width of the recesses 33a determines a width of copper plating absent regions 17 and 21.

Since the copper plating absent regions 17 and 21 (See FIGS. 4 and 5) are determined with the mask 33, the mother board 11 has no burrs produced during separation along the cutting strips 16 and 20. That is, separated regions of each substrate 12 has a better quality, even by a visual inspection, than a conventional substrate having signal electrode regions which are cut directly.

(Embodiment 2)

A printed mother board 11 according to Embodiment 2 is identical to that of Embodiment 1 shown in FIG. 3 through FIG. 6, but different therefrom with regard to a manufacturing method.

Figure 8:
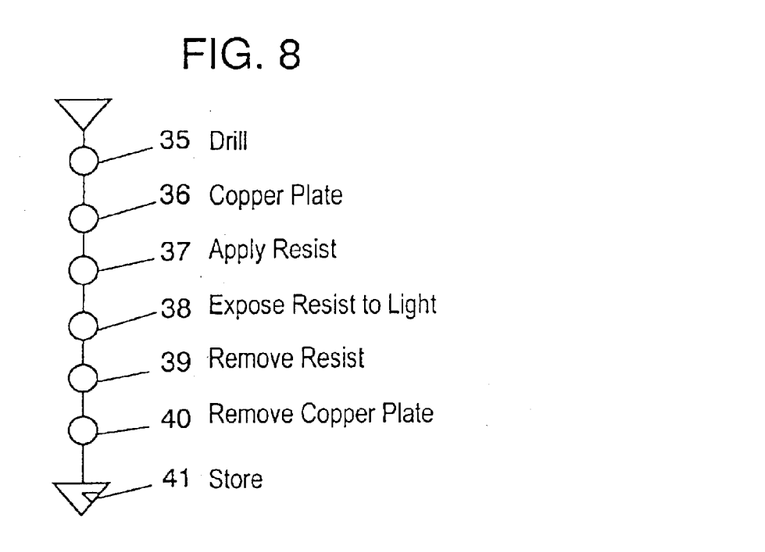
FIG. 8 is a flowchart for manufacturing a printed mother board according to Embodiment 2 of the present invention.
Figure 9:
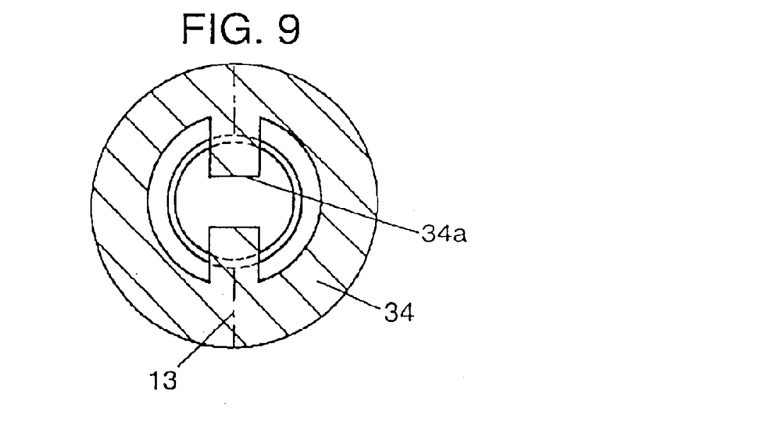
FIG. 9 is an enlarged plan view of a primary part of the printed mother board according to Embodiment 2.

FIG. 8 is a flowchart for manufacturing a printed mother board 11 with a negative photo-resist according to Embodiment 2 of the present invention. A through-hole is drilled at a region for a signal electrode at a joint 13 between two adjacent substrates 12 of the printed mother board 11 (Step 35). A region about the through-hole is copper-plated (Step 36), coated with a resist (Step 37), and exposed to light through a mask 34 as shown in FIG. 9 (Step 38). The mask 34 has projections 34a positioned over a region for a signal electrode of the two adjacent substrates 12. The adjacent substrates 12 are linked to each other along the joint 13. The resist is removed, except that portions not corresponding to the projections 34a of the mask 33 are exposed to light and thus cured. Uncured portions of the resist protected with the projections 34a are removed by etching (Step 39). A copper-plated portion covered with no resist (corresponding to the projections 34a) is also removed by etching (Step 40). The printed mother board 11 is stored (Step 41). A method of manufacturing a high-frequency module is Identical to that of Embodiment 1 as described with reference to FIG. 7.

As shown in FIG. 9, the projections 34a of the mask 34 for manufacturing the printed mother board 11 are separated from each other by 180 degrees for determining the signal electrodes 15 of substrates 12. For determining signal electrodes 19 at a corner joint 18, the mask 34 would have four projections 34a provided at equal intervals of 90 degrees. In this case, the mask 34 has the projections 34a positioned along the joint 13 between the substrates 12. A width of the projection 34a determines a width of copper-plating-absent regions 17 and 21 of the signal electrodes 15 and 19. Since the copper-plating-absent regions 17 and 21 (FIG. 4 and FIG. 5) are determined by a shape of the mask 34, burrs are hardly produced during separation along the joint 13. Edges at a signal electrode have significantly improved quality as compared with a conventional substrate, even by visual inspection.

(Embodiment 3)

Figure 10:
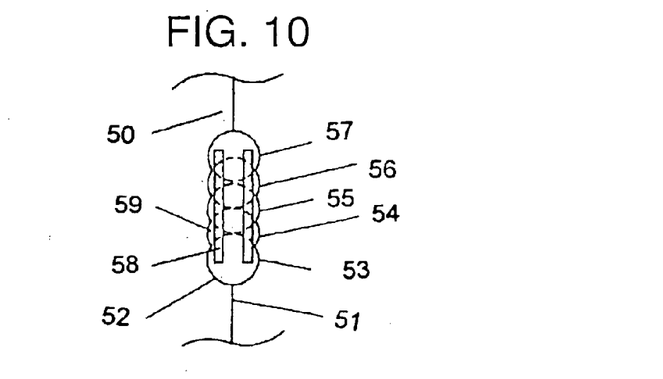
FIG. 10 is a plan view of a region adjoining a hole of a printed mother board according to Embodiment 3 of the present invention.

FIG. 10 is an enlarged plan view of a primary part for explaining a method of manufacturing a signal electrode 52 provided along a joint 51 between two substrates 50. Along the signal electrode 52, a row of round holes 53 to 57 each having a radius R is formed at an equal distance R. The radius R of the round holes is 0.5 mm in this embodiment. The round holes may be formed by drilling. It is also noted that the round holes are drilled alternately. For example, round hole 53 is drilled, and then round hole 55 and round hole 57 are drilled. Then, round hole 54 and round hole 56 are drilled. Thereby, centers for drilling are not diverted, whereby the round holes are located accurately.

A shield case has a leg 58 placed over one of the substrates 50, and forms a space 59 between the signal electrode 52 and the leg. The space 59 between the signal electrode 52 and the leg 58 is filled up with a solder paste via capillary action, thus improving secure soldering of the case.

(Embodiment 4)

A high-frequency module manufactured by the method of Embodiments 1 to 3 will be described. The module includes a substrate 62 identical to a substrate 12 described in Embodiments 1 to 3.

Figure 11:
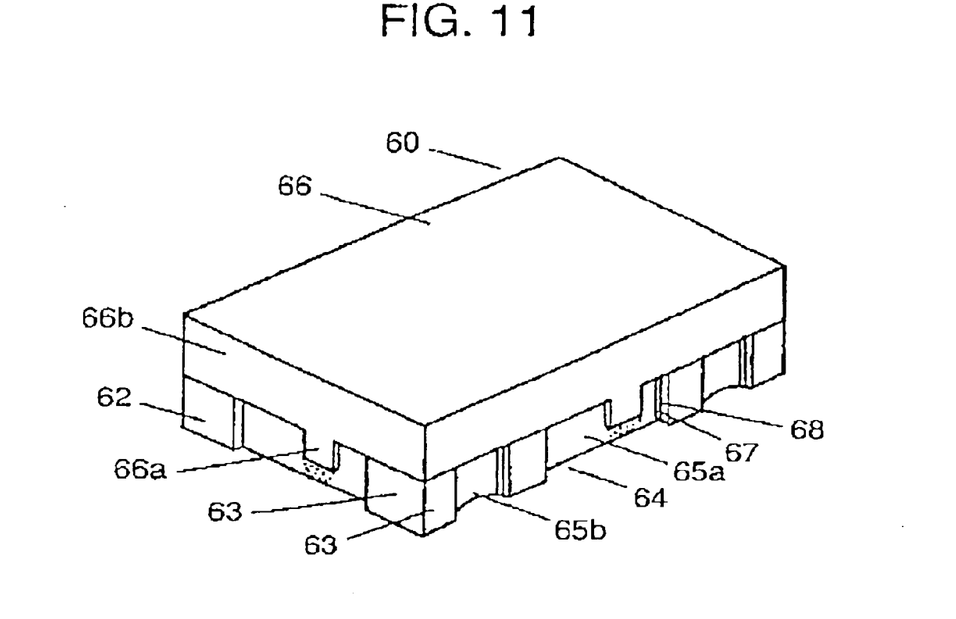
FIG. 11 is a perspective view of a high-frequency module according to Embodiment 4 of the present invention.

FIG. 11 is an external perspective view of a high-frequency module 60. The high-frequency module 60 includes the substrate 62 having substantially a four-sided shape, a recess 64 provided in a cut side 63 of the substrate 62, a signal electrode 65 provided in the recess 64, an electronic component mounted on the substrate 62, and a shield case 66 for shielding the electronic component. The signal electrode 65 has an end 67 separated from the cut side 63 by a thickness 68 of an insulator (air in the present embodiment), such that no portion of the signal electrode is co-planar with the cut side.

Since the thickness 68 of the air provided between the end 67 and the cut side 63 allows the signal electrode 65 to be intact during separation of the substrate 62 from a mother board, no burrs are produced. The signal electrode 65, because of being provided in the recess 64, is hardly polluted during handling. Also, an overall mounting area of the module can be reduced.

The signal electrode 65 is classified into a large size signal electrode 65a and a small size signal electrode 65b. The large size signal electrode 65a may be used for grounding, and the small size signal electrode 65b may function as an ordinary signal electrode. If not being classified, the signal electrodes may be sized identically.

Figure 12:
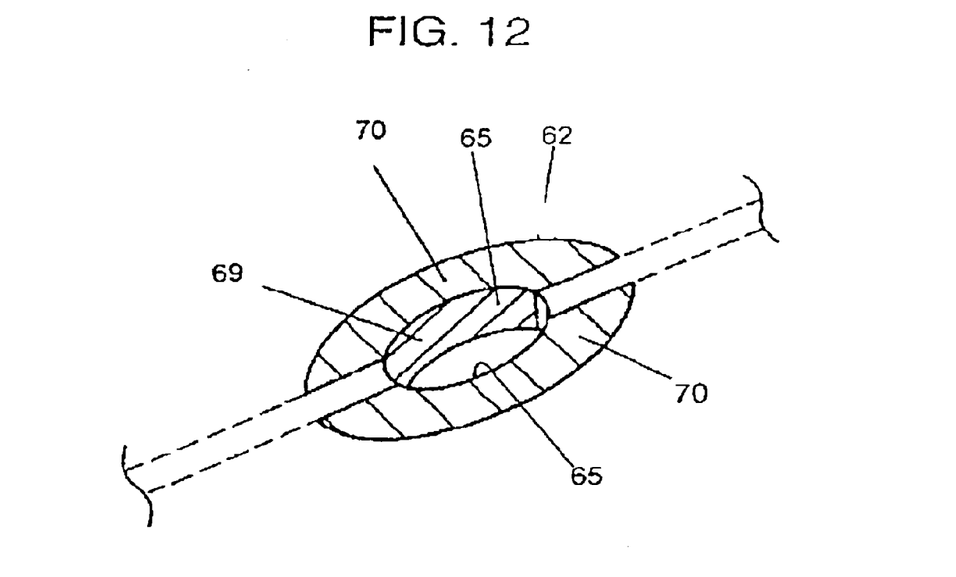
FIG. 12 is a perspective view of a primary part of the high-frequency module of Embodiment 4.

FIG. 12 is a perspective view of a region 69 for the signal electrode 65. The region 69 consists of a land 70 mounted on upper and lower sides of the substrate 62. Upon having the signal electrodes 65 connected at a lower side of the substrate, the module can reduce an overall size of a device including the module mounted thereto.

Figure 13:
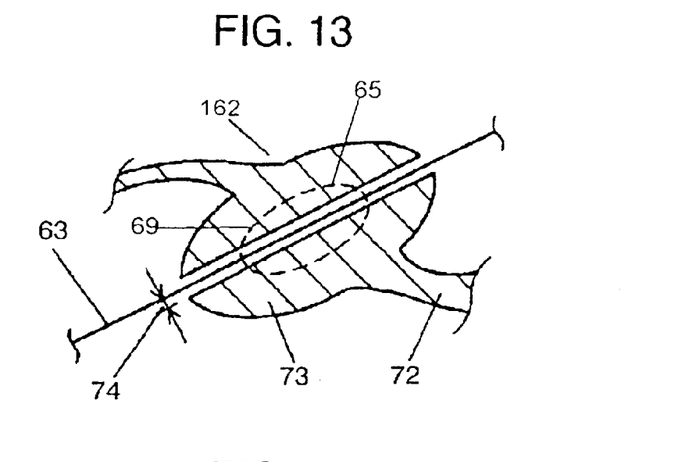
FIG. 13 is a perspective view of a primary part of an internal layer substrate of Embodiment 4.

FIG. 13 illustrated an internal layer 162 of the substrate 62 of this embodiment having a multi-layer construction. As shown, the substrate 62 includes the internal layer 162 in a printed mother board, a worksheet form, before being separated into substrates 62. A pattern 72 on the internal layer 162 of the substrate 62 is connected to a land 73 connected to region 69 for a signal electrode 65 with a though hole. The signal electrode 65 is separated along a cut line 63. The cut line 63 is spaced by a distance 74 from the land 73. The distance 74 allows the substrates 62 in the worksheet form to be inspected prior to separation. That is, signal electrodes 65 of any two adjacent substrates 62 in the worksheet form are electrically isolated from each other, and thus, signals to them can be separated without a dummy substrate.

Figure 14:
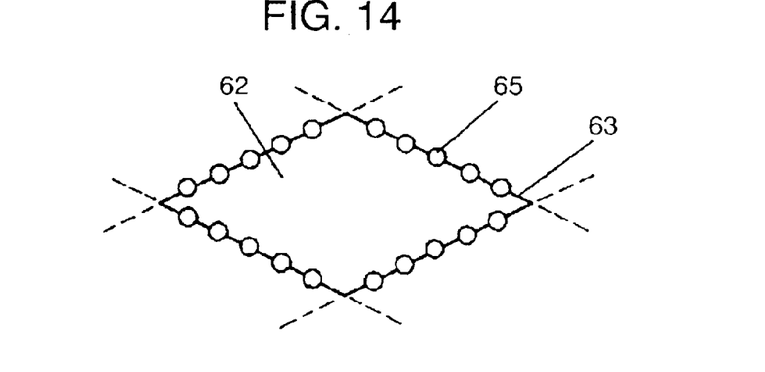
FIG. 14 is a perspective view showing the high-frequency module and its neighboring area according to Embodiment 4.

FIG. 14 is a perspective view of the substrates 62 in the worksheet form. Because of having five signal electrodes 65 on each cut side 63 thereof, each substrate 62 forms a high-frequency module having various functions. The signal electrodes 65 are prevented from undesired burrs.

Because of being provided on all four lateral sides of a substrate 62 of substantially a four-sided shape, the signal electrodes 65 are electrically isolated from each other despite small dimensions of the substrate 62. Therefore, the signal electrodes provide a high-frequency module flexibly designed with regard to patterns, and the module provides an apparatus with a significantly-reduced overall size.

In Embodiment 4, the large-sized signal electrode 65a is in the recess 64 of the substrate 62 for grounding, which recess is formed from a series of drilled round 53 to 57 (as shown in FIG. 10) which extend from the upper side to the lower side of the substrate 62. Thus, the electrode 65a can preferably be formed by a simple drilling process. The shield case 66, upon being placed over the substrate 62 before soldering, has a leg 66a to create a space between the leg and the signal electrode 65a. The space, upon being filled with soldering paste by a capillary action, allows the leg 66a to be soldered securely to the signal electrode 65a.

Because of including the substrate 62 covered with the shield case 66 connected at legs 66a to the signal electrode 65a for grounding, a high-frequency module is handled easily, and receives and transmits little noise between it and an exterior thereof.

The signal electrode 65 of the substrate 62 and the leg 66a of the shield case 66 will be explained.

Figure 15:
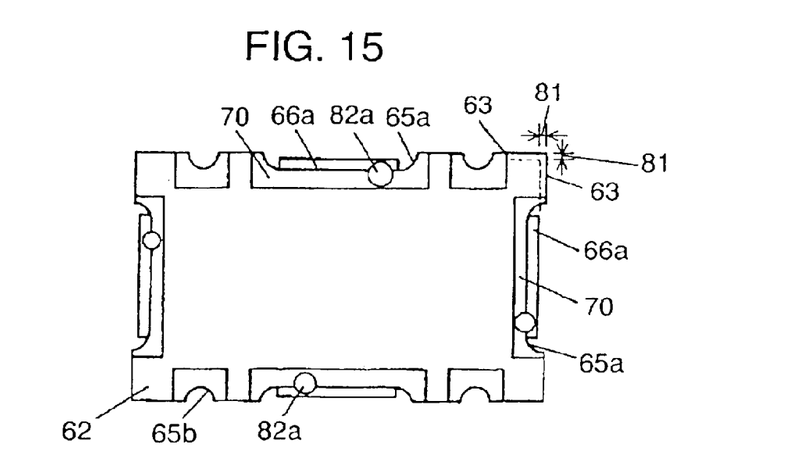
FIG. 15 is a plan view of a back side of the high-frequency module of Embodiment 4.

FIG. 15 is a plan view of a high-frequency module including the substrate 62 and the shield case 66 soldered to the substrate 62. Horizontal and vertical sides of the substrate 62 in the drawing are determined from cut lines. In this embodiment, the cut lines, i.e., sides 63 of the substrate 62 are spaced by a gap 81 of 0.07 mm to 0.15 mm from the leg 66a of the shield case 66. In other words, the cut side 63 projects by the gap 81 from legs 66a of the shield case 66. This protects the shield case 66 from being injured by a cutter during separation of substrates 62 from a printed mother board, i.e. a worksheet form. If the gap is too small, lateral sides of the shield case 66 may be injured during such separation. Also, the sides 63, if located further outwardly, increase an overall size of the high-frequency module.

Since the shield case 66 is placed over a printed mother board as a worksheet form, a pattern of solder paste is transferred onto a back, lower side of the mother board. After soldering, remaining spots 82a of the solder paste are deposited on land 70 of the substrate 62.

As described above, the shield case 66 has the leg 66a soldered to the signal electrode 65. The sides 63 of the substrate 62, because of extending further outwardly than the leg 66a of the shield case 66, protect solder between the leg 66a and the signal electrode 65 from external stress, thus preventing cracking of the solder.

A modification of shield case 66 on substrate 62 will be explained. A shield case 66, upon having an outer surface thereof roughened or textured, exhibits an increase in surface area. This improves a property for heat radiation, and therefore, enables the shield case 66 to reduce an influence from heat developed from a component on the substrate 62. The shield case 66 may have lateral sides roughened with a dicing cutter during separation of the substrate 62. This allows side 63 of the substrate 62 not to project outwardly from a lateral side of the shield case 66, thus contributing to reduction of a size of the module. Also, a dicing process can simultaneously entail two different steps, separation of substrates 62 and roughening of the shield case 66, hence eliminating an extra roughening step. Roughening may be performed on all the lateral sides or one particular lateral side. So long as an upper side of the shield case is not roughened or textured, the module can remain not declined In appearance.

Figure 16:
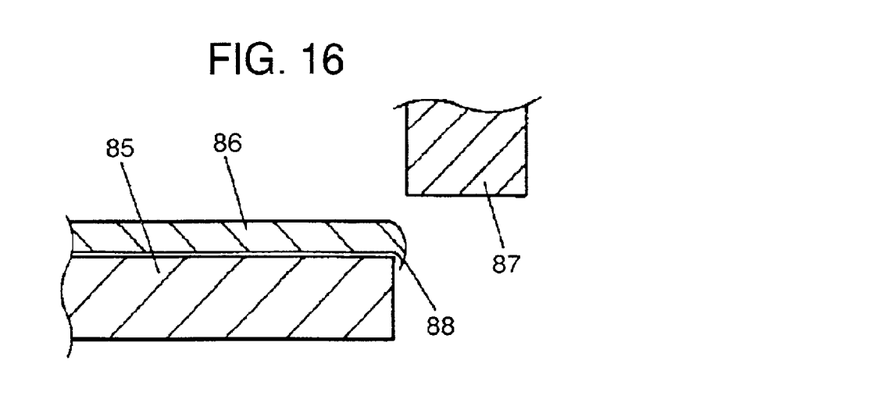
FIG. 16 is a cross sectional view of a primary part of a shield case die according to Embodiment 4.
Figure 17:
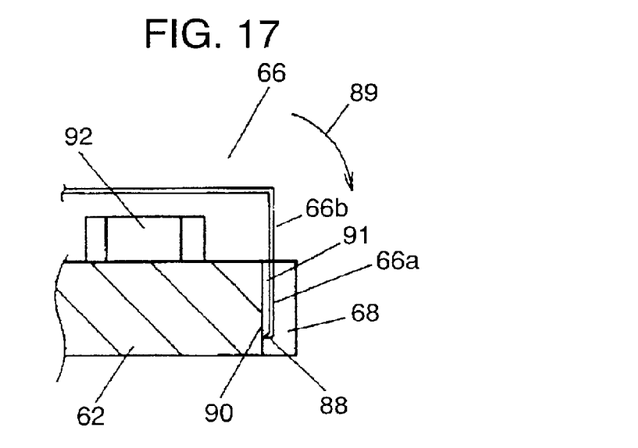
FIG. 17 is a cross sectional view of a primary part of the high-frequency module of Embodiment 4.

The shield case 66 is manufactured from a metal sheet 86, such as a tin-plated steel sheet, held on a die 85 and punched out into a shape with a punching die 87. This punching may produce burrs on an edge of the metal sheet 86, as shown in FIG. 16. The metal sheet 86 is then bent in a direction of the punching to form a bend 66b as shown in FIG. 17. Leg 66a is shaped on the bend 66b, and then the shield case 66 is completed. Since the shield case 66 is joined at a signal electrode 65 to substrate 62, burr 88 produces a gap 91 between a side wall 90 of signal electrode 65 and the leg 66a. The gap 91 allows soldering paste, molten by re-flow heat, to be distributed uniformly by a capillary effect. The burr 88, because of not extending toward neighboring substrate 62, ensures a distance from the neighboring substrate 62 and allows a high-frequency module 60 to be protected on its lateral sides. In FIG. 17, a resistor 92, i.e. a heat generating component, is mounted on the substrate 62.

Then, the shield case 66 has its upper side provided with a mark that is impressed thereon. The mark, upon being made at once on an array of shield cases 66 in a worksheet form, is produced efficiently. The mark, upon being made with laser beam, is provided at a uniform position regardless of a type of module to be produced, and thus a quality appearance is provided. The mark is made with a laser beam easily at high speed. Moreover, the mark made by a laser beam can remain intact when being touched by a finger.

As set forth above, the substrate 62 of this embodiment is extended at the sides 63 outwardly from the shield case 66. This allows a soldered region of the shield case 66 not to accept directly any external stress, and not to crack. The shield case 66 is protected from being injured by a cutter for separating substrates 62 from a printed mother board of a worksheet form.

Alternatively, a cut side of substrate 62, upon being substantially identical to side 63, allows a high-frequency module to have a reduced overall size. This reduces a redundant portion of a pattern of a printed circuit on a printed mother board to have a redundant portion.

The shield case 66, upon being roughened on its lateral side more than its upper side, exhibits an increase in surface area, thus exhibiting improved heat its lateral side, increasing friction, allows a high-frequency during a manufacturing process.

In each of the above embodiments, because the mother board is cut through portions of the interior surface of the hole from which metal plating bas been removed, the resulting substrate will have a surface, defined by the cut, with which no portion of an electrode (the metal plating within the hole) is co-planar.

What is claimed is:

1. A module comprising:
   a substrate having an upper side, and a lower side, and a lateral side that defines a surface;
   a recess in said lateral side; and
   an electrode in said recess and spaced from said lateral side such that no portion of said electrode is co-planar with said surface.

2. The module according to claim 1, further comprising:
   an electronic component mounted on said substrate.

3. The module according to claim 2, further comprising:
   a land, on said upper side, adjacent said recess and connected to said electrode; and
   a land, on said lower side, adjacent said recess and connected to said electrode.

4. The module according to claim 2, wherein
   said substrate comprises a multi-layer substrate that includes a land adjacent said electrode, and an internal layer having a pattern, with said land being connected to said pattern and said electrode.

5. The module according to claim 2, further comprising:
   another electrode at said lateral side.

6. The module according to claim 2, wherein said substrate has a corner, and further comprising:
   another electrode at said corner.

7. The module according to claim 2, wherein said recess comprises plural recesses that extend from said upper side to said lower side.

8. The module according to claim 7, further comprising:
   a metal shield case covering said electronic component, said metal shield case having a leg joined to said electrode.

9. The module according to claim 8, wherein
   said lateral side is positioned outwardly beyond said metal shield case.

10. The module according to claim 8, wherein
    said metal shield case has a lateral side, with said lateral side of said substrate being substantially flush and parallel with said lateral side of said metal shield case.

11. The module according to claim 8, wherein
    said metal shield case has a lateral side and an upper side, with said lateral side of said metal shield case being more textured than said upper side of said metal shield case.

12. The module according to claim 8, wherein
    said leg is soldered to said electrode.

13. A method comprising:
    forming a hole in a mother board from which substrates are to be provided by cutting said mother board;
    forming a metal plated portion on said mother board around said hole and on an interior surface of said hole;
    covering said metal plated portion with a resist;
    curing said resist;
    placing a mask over said resist so as to expose regions of said resist, which regions include portions of said resist that are positioned over part of said metal plated portion on said interior surface of said hole;
    subjecting the exposed regions of said resist to light so as to decompose said exposed regions of said resist;
    removing the decomposed exposed regions of said resist so as to expose the part of said metal plated portion on said interior surface of said hole over which the exposed portions of said resist were positioned; and
    removing the exposed part of said metal plated portion from said interior surface of said hole.

14. The method according to claim 13, further comprising:
    cutting said mother board through portions of said interior surface of said hole from which said exposed part of said metal platted portion was removed.

15. The method according to claim 13, wherein
    forming a hole in a mother board comprises forming a hole at a location that is to correspond to a corner of a substrate to be provided by cutting said mother board.

16. The method according to claim 13, wherein
    forming a hole in a mother board comprises forming a slot in said mother board by consecutively drilling round holes.

17. The method according to claim 16, wherein
    consecutively drilling round holes comprises first drilling a first hole, then drilling a second hole, and then drilling a third hole, with said third hole being positioned between said first and second holes.

18. A method comprising:
    forming a hole in a mother board from which substrates are to be provided by cutting said mother board;
    forming a metal plated portion on said mother board around said hole and on an interior surface of said hole;
    covering said metal plated portion with a resist;
    placing a mask over said resist so as to expose regions of said resist while covering other regions of said resist, which other regions include portions of said resist that are positioned over part of said metal plated portion on said interior surface of said hole;
    subjecting the exposed regions of said resist to light so as to cure said exposed regions of said resist while leaving the covered regions of said resist uncured;
    removing the uncured regions of said resist so as to expose the part of said metal plated portion on said interior surface of said hole over which the covered portions of said resist were positioned; and
    removing the exposed part of said metal plated portion from said interior surface of said hole.

19. The method according to claim 18, further comprising:
    cutting said mother board through portions of said interior surface of said hole from which said exposed part of said metal plated portion was removed.

20. The method according to claim 18, wherein
    forming a hole in a mother board comprises forming a hole at a location that is to correspond to a location where four adjacent substrates are to meet upon cutting said mother board.

21. The method according to claim 18, wherein
    forming a hole in a mother board comprises forming a slot in said mother board by consecutively drilling round holes.

22. The method according to claim 21, wherein
    consecutively drilling round holes comprises first drilling a first hole, then drilling a second hole, and then drilling a third hole, with said third hole being positioned between said first and second holes.

* * * * *

UNITED STATES PATENT AND TRADEMARK OFFICE
CERTIFICATE OF CORRECTION

PATENT NO. : 6,798,665 B2 Page 1 of 1
APPLICATION NO. : 10/090786
DATED : September 28, 2004
INVENTOR(S) : Junichi Kimura It is certified that error appears in the above-identified patent and that said Letters Patent is hereby corrected as shown below:

In column 8, line 13, change "platted" to --plated--.

Signed and Sealed this

Sixth Day of March, 2007

JON W. DUDAS
*Director of the United States Patent and Trademark Office*